(12) United States Patent
Millet

(10) Patent No.: US 9,250,285 B2
(45) Date of Patent: Feb. 2, 2016

(54) METHOD AND ARCHITECTURE FOR DETECTING INACCESSIBLE ELECTRICAL ANOMALIES BY MEANS OF REFLECTOMETRY

(71) Applicant: AIRBUS OPERATIONS (S.A.S.), Toulouse (FR)

(72) Inventor: Gilles Millet, Lézat sur Lèze (FR)

(73) Assignee: Airbus Operations (S.A.S.), Toulouse (FR)

( * ) Notice: Subject to any disclaimer, the term of this patent is extended or adjusted under 35 U.S.C. 154(b) by 351 days.

(21) Appl. No.: 13/796,735

(22) Filed: Mar. 12, 2013

(65) Prior Publication Data

US 2013/0200904 A1 Aug. 8, 2013

Related U.S. Application Data

(63) Continuation of application No. PCT/FR2011/052082, filed on Sep. 13, 2011.

(30) Foreign Application Priority Data

Sep. 15, 2010 (FR) ...................................... 10 57344

(51) Int. Cl.
*G01R 31/08* (2006.01)
*G01R 31/11* (2006.01)
*G01R 27/00* (2006.01)

(52) U.S. Cl.
CPC .............. *G01R 31/11* (2013.01); *G01R 31/086* (2013.01)

(58) Field of Classification Search
CPC .... G01R 31/11; G01R 31/008; G01R 31/021; G01R 31/025; G01R 31/085; G01R 31/086; G01R 31/088; G01R 31/08; G01R 31/1272; G01R 31/007; G01R 31/02; G01R 31/024; G01R 19/1659; G01R 22/00; G01R 27/00; H04B 10/0771
USPC ......... 324/543, 527, 537, 239, 503, 512, 522, 324/523, 525, 539, 612, 617, 71.1, 722, 324/533–534, 538, 555, 718; 702/5, 35, 36, 702/58, 59, 34
See application file for complete search history.

(56) References Cited

U.S. PATENT DOCUMENTS 5,185,579 A * 2/1993 Mertens et al. ............... 324/527
5,376,889 A * 12/1994 Milroy et al. ................. 324/644
(Continued)

FOREIGN PATENT DOCUMENTS

DE 10 2004 045964 4/2006
DE 10 2007 032233 1/2009
(Continued)

OTHER PUBLICATIONS

International Search Report and Written Opinion for PCT/FR2011/052082 dated Dec. 2, 2011.

*Primary Examiner* — Tung X Nguyen
*Assistant Examiner* — Neel Shah
(74) *Attorney, Agent, or Firm* — Jenkins, Wilson, Taylor & Hunt, P.A.

(57) ABSTRACT

Detection and location of electrical faults in a network of metal structures which can receive electric cables and allow return of current by the cables. The reflectometry-based method involves injecting a probe signal into a cable coupled to the structures and analyzing the signal reflected by the anomalies. A conductive element is provided for carrying the probe signal at a constant distance from each structure. In one aspect, an insulated conductive element is arranged inside the metal structure and is built into a longitudinal groove in a surface for receiving a longitudinal plastic holder wedged into the structure. The reflected signal from the conductive element is compared to a threshold above which an anomaly is detected, and the anomaly is located by topological correlation. The invention is useful for airplane raceways having a composite skin.

13 Claims, 4 Drawing Sheets

(56) References Cited

U.S. PATENT DOCUMENTS

| | | | |
|---|---|---|---|
| 5,479,610 A * | 12/1995 | Roll-Mecak et al. | 714/25 |
| 6,448,781 B1 | 9/2002 | Frank et al. | |
| 6,743,976 B2 | 6/2004 | Motzigkeit | |
| 6,875,916 B2 | 4/2005 | Winkelbach et al. | |
| 6,909,977 B2 * | 6/2005 | Orton | 702/65 |
| 6,954,076 B2 * | 10/2005 | Teich | 324/540 |
| 7,120,563 B2 | 10/2006 | Bechhoefer | |
| 7,215,126 B2 | 5/2007 | Furse et al. | |
| 7,633,285 B2 * | 12/2009 | Rahmatian et al. | 324/107 |
| 7,696,433 B2 | 4/2010 | Winkelbach et al. | |
| 2004/0230385 A1 | 11/2004 | Bechhoefer et al. | |
| 2005/0194978 A1 | 9/2005 | Smith | |
| 2007/0085550 A1 | 4/2007 | Wu et al. | |
| 2008/0134477 A1 | 6/2008 | Hart et al. | |
| 2009/0026318 A1 | 1/2009 | Gross et al. | |

FOREIGN PATENT DOCUMENTS

| | | |
|---|---|---|
| EP | 1367683 | 12/2003 |
| EP | 1411611 | 4/2004 |

* cited by examiner

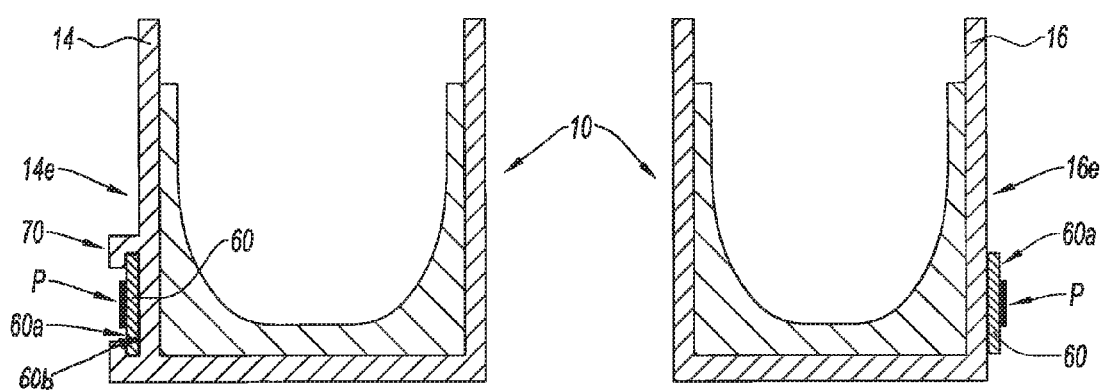
*Fig. 5a*  *Fig. 5b*

METHOD AND ARCHITECTURE FOR DETECTING INACCESSIBLE ELECTRICAL ANOMALIES BY MEANS OF REFLECTOMETRY

TECHNICAL FIELD

The invention relates to a method and an architecture for detecting, by reflectometry, inaccessible electrical anomalies such as losses or defects in the flow of current in an electrical conductor.

BACKGROUND

Defects in current return paths are a common type of anomaly, which are in general difficult to localize in electrical assemblies. Thus, in state-of-the-art airplanes with skins made of composites such as carbon fiber reinforced plastics (CFRCs), the skin can no longer provide the current return path between the passengers and power supplies or provide electromagnetic protection, which functions were in the past provided by the metal skin of the airplane.

To overcome the above, networks of electrical structures are used. These networks incorporate primary metal structural parts and specific conductors. In particular, U-shaped or I-shaped metal structures (or "raceways") are used to support cables along the length of the fuselage or cargo-hold ceiling of an airplane. These raceways consist of elements interconnected by metal braids, and are used both as screens to provide electromagnetic protection, and to support electrical cabling routed over large distances.

However, above all, these raceways provide a return current path for the currents carried by the cables, since they form a low-impedance current line with the cables that they contain. Under these conditions, it is essential to be able to detect the loss of a braid or the degradation of its electrical functions throughout the life cycle of the airplane.

Specifically, the cabling of modern airplanes can be several hundred kilometers in length and reliable diagnosis of the validity of the electrical network is something that is important, even vital.

This detection cannot generally be done with an ohmmeter because the raceways are connected to the ESN at many points—the loss or degradation of a braid is insignificant relative to the total resistance of the ESN. Individual testing of the braids is not possible for reasons of cost, due to their large number and inaccessibility.

Moreover, it has already been envisioned to use reflectometry, a diagnosis method based on the radar principle, to test for defects in electrical circuits. Reflectometry is a diagnosis method based on injecting a test signal into a medium to be diagnosed. Some of the energy of this signal, which propagates according to the propagation law of the medium in question, is reflected back toward the injection point when it encounters a discontinuity. The main advantage of this technique is that only a single circuit access point is required.

For example, patent U.S. Pat. No. 7,215,126 describes a mixed signal reflectometer in which a combined signal is generated comprising a superposition of a test signal injected at a single injection point, and reflections of this signal generated in the circuit. This reflectometer comprises a test signal generator, a detector configured to determine an autocorrelation of the combined signal, and an analyzer configured to evaluate a characteristic of the circuit depending on this autocorrelation.

This solution can be classed among the various known techniques for testing electrical cabling by reflectometry.

These techniques comprise generating a test signal, detecting reflected signals, and analyzing these signals, like in the aforementioned apparatus. These techniques either function in the frequency domain (FDR) or in the time domain (TDR) depending on the nature of the injected signal: FDR uses a frequency-modulated sinusoidal signal, and TDR a modulated pulse signal.

Reflectometry may be used to test a network of raceways by coupling this network to electrical cabling composed of insulated cables and placed along the raceways. Each cable is then electrically connected at one of its ends to the associated raceway, and is equipped at its other end with a connector allowing it to be connected to a detecting and analyzing reflectometry device. A transmission line for transmitting the signal is thus created by the presence of cables associated with the ground plane formed by the raceway. Injecting a test signal into the cable via the connector results in a reflected signal, a timing diagram of intensity variations as a function of time.

In the graph obtained via an oscilloscope, using appropriate units, a first "positive" peak appears in the reflected signal, this first peak having a much larger amplitude than that of the other positive peaks: this first peak corresponds to the signal injected at the start of the line. The last "negative" peak (i.e. this peak is inverted relative to the first) corresponds to the signal reflected by the short circuit at the end of the line. Intermediate peaks, which appear between the first and last peaks are due to fluctuations in the impedance of the transmission line. The spectrum obtained is the reference signature of the raceway.

A raceway connection defect, for example disconnection or poor connection of a braid, generates an impedance break. The test signal will reflect from this break. This reflection results in a region of the graph deviating from the reference graph, a reflection peak forming in this region.

Such changes in the spectrum are detected, and the defects thus localized, during maintenance testing, by comparing the actual measurement and the reference signature recorded on delivery.

However, when the defects result in variations in the reflected signal with intensities that are equivalent to or about the same as those of the fluctuations in impedance, it becomes difficult to detect and localize this type of defect. However, the intensity of these fluctuations may be sufficiently large that certain defects go undetected, or become hard to detect.

SUMMARY

The invention thus aims to make it possible to unambiguously detect and localize electrical defects in raceway networks, in a simple and straightforward manner i.e. without it being necessary to store raceway signatures in memory. Specifically, it has been observed that impedance fluctuations are particularly sensitive to variations in distance between the conductor and the corresponding raceway acting as the ground plane.

More precisely, one subject of the present invention is a method for detecting, by reflectometry, inaccessible electrical anomalies in networked metal structures able to accommodate electrical cables and to provide a return current path for these cables. A modulated test signal is injected into a first end of insulated conductive elements, these elements being arranged a constant distance away from each structure substantially along the entire length of these supporting means and being connected to this structure at a second end. A reflected signal, returned via the conductive elements, is detected and analyzed by comparing it to a threshold above which an anomaly is detected and localized by topological correlation.

According to particular embodiments:

the reflectometry may be carried out in the frequency domain (FDR) and in the time domain (TDR) with a test signal having a modulated frequency or a modulated pulse, respectively;

the conductive elements are arranged in material continuity with the metal structures.

The invention also relates to a detection architecture able to implement the method defined above. Such an architecture comprises at least one longitudinal metal structure for accommodating an electrical cable and at least one insulated conductive element connected to means for emitting and injecting a test signal and connected to a device for detecting and analyzing a reflected signal at a first end and with said structure at a second end. The conductive element is arranged against said structure by way of a material of constant thickness.

According to preferred embodiments:

the insulated conductive element is placed inside said metal structure and incorporated into an accommodating side of a longitudinal supporting means made of plastic and wedged in said structure, said accommodating side having a curvature able to house the electrical cable;

the insulated conductive element is incorporated into said supporting means in a longitudinal groove formed in the accommodating side of the supporting means, preferably in a zone where the supporting means has a minimum radius of curvature;

having two longitudinal main faces, the strip being placed, via its other main face, against an external side of the metal structure;

the strip of printed circuit board is press-fitted into a slide of suitable size formed along an external side of said structure;

the printed circuit-board strip is adhesively bonded against an external face of said structure;

the insulated conductive element is attached, preferably by clip-fastening, to said structure by a terminal crimped onto the second end of the conductive element, and is connected via its first end to the detecting and analyzing device by way of a connecting means fastened to said structure;

the detecting and analyzing device also comprises means for emitting the test signal; and the injecting means and connecting means form a single connector.

BRIEF DESCRIPTION OF THE DRAWINGS

Other aspects and particularities of the implementation of the invention will become apparent on reading the following detailed description, which is accompanied by the appended drawings which show, respectively.

Identical reference signs used in the figures refer to identical or equivalent elements.

DETAILED DESCRIPTION

Figure 1A:
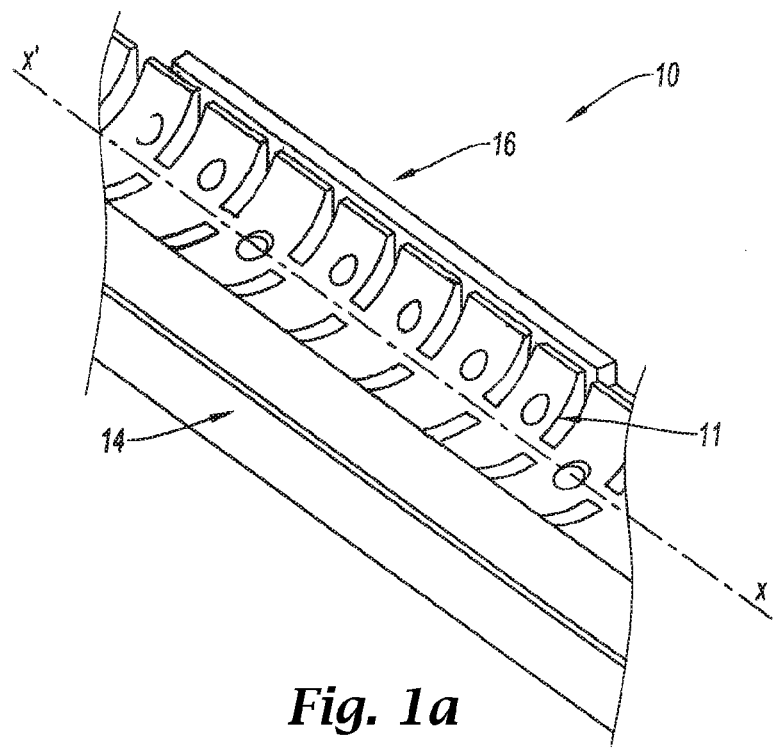
in FIGS. 1a and 1b, a perspective view and a top view, respectively, of an example of an elementary supporting means.
Figure 1B:
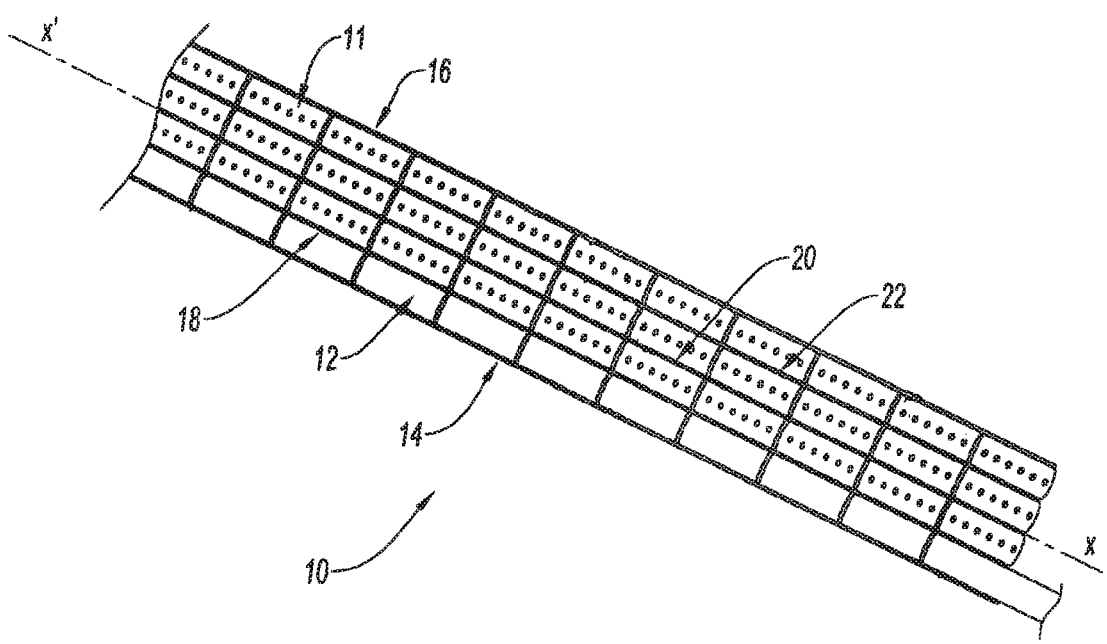

With regard to FIGS. 1a and 1b, two elementary metal structures 10 may be seen that can respectively accommodate one and four electrical cables, such as the cable 12. The elementary structure 10 is about two meters in length and has external longitudinal walls 14 and 16 (see FIG. 3a) and internal longitudinal walls 18, 20 and 22 (in the case of the structure with multiple housings in FIG. 3b), lying parallel to the axis X'X of the structure 10.

A longitudinal supporting means made of a plastic 11 is wedged in the structure so as to accommodate the cables 12 on an accommodating side 11a having a curvature able to house the electrical cable. Fasteners 24 are placed at regular intervals along each cable housing 26 defined between two walls.

Fittings 28 are also provided for fastening the elementary structure 10 to a frame.

Figure 2:
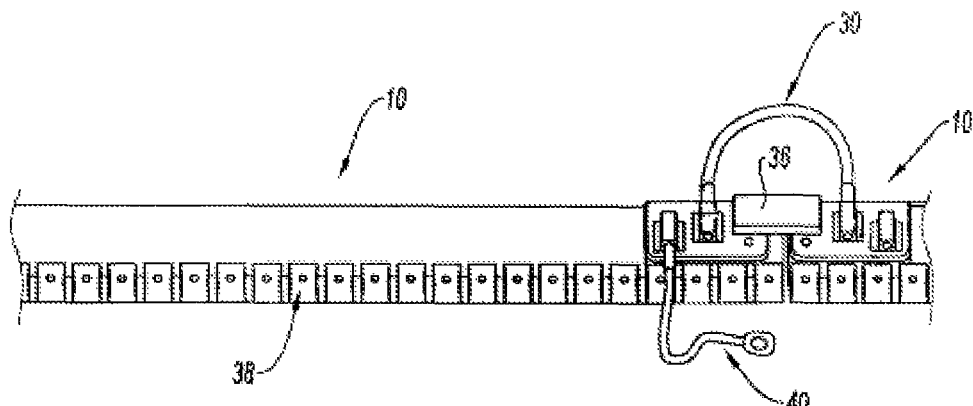
FIG. 2, an interconnection between two elementary supporting means in order to form a cable.

FIG. 2 shows the interconnection of two of these elementary structures 10 on the back of these structures, a set of elementary structures interconnected in this way forming a raceway.

Electrical interconnection is obtained by braided lengths of a flexible insulated connecting cable 30. This cable has, at its ends, metal connectors 32 in which the ends of the braids are crimped, the connectors being press-fitted into female mountings 34 fastened to the back of the structures 10.

Mechanical interconnection between two structures 10 is obtained by a small bar 36 fastened to each structure 10, one of the fastenings being removable. A rail 38 of electrical connections is also provided, and other connecting cables 40 for the return current from nearby electrical devices, or for use as a connection terminal, as in one embodiment of the invention as explained below.

Figure 3:
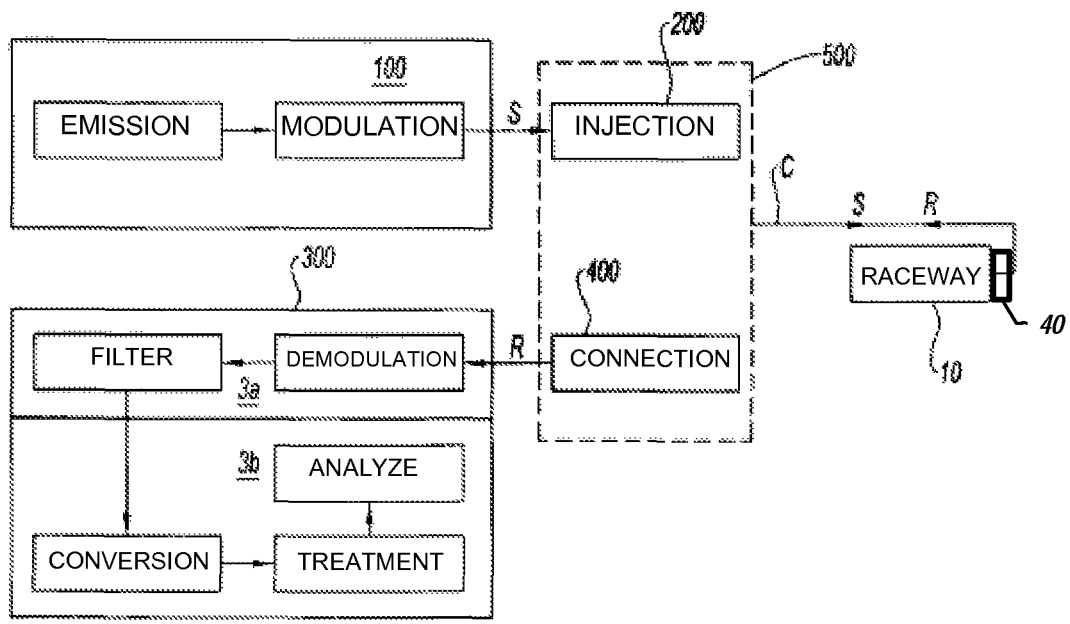
FIG. 3, a diagram of the main steps of processing a signal by reflectometry.

The main steps of signal processing by reflectometry, such as applied to the raceways in order to detect electrical anomalies via the return current, are illustrated in the diagram in FIG. 3. A test signal S is emitted by and modulated in a signal generator 100, the modulation possibly being frequency or pulse modulation. This signal S is injected at a first end of an insulated conductive element C, by injecting means 200.

The conductor C, which provides the return current path, is placed a constant distance away from a metal raceway structure 10 and connected to the end of this raceway by way of various means that will be described in more detail below. A reflected signal R delivered by the conductor C is transmitted to a device 300 for detecting and analyzing the signal via connection means 400.

The injection and connection means may advantageously be grouped together and form a single connector 500, and the generator and detection/analysis device may advantageously be a single piece of apparatus 600.

The reflected signal R is demodulated and filtered in a detection part 3a of the device 300, then converted into digital data which are then processed so as to be analyzable in a data processing part 3b of the device 300. This data is analyzed by comparison with a threshold above which an anomaly is considered to have been detected. This anomaly is then localized in the raceway network by correlating the data and the topology of the network, stored in memory beforehand.

Figure 4A:
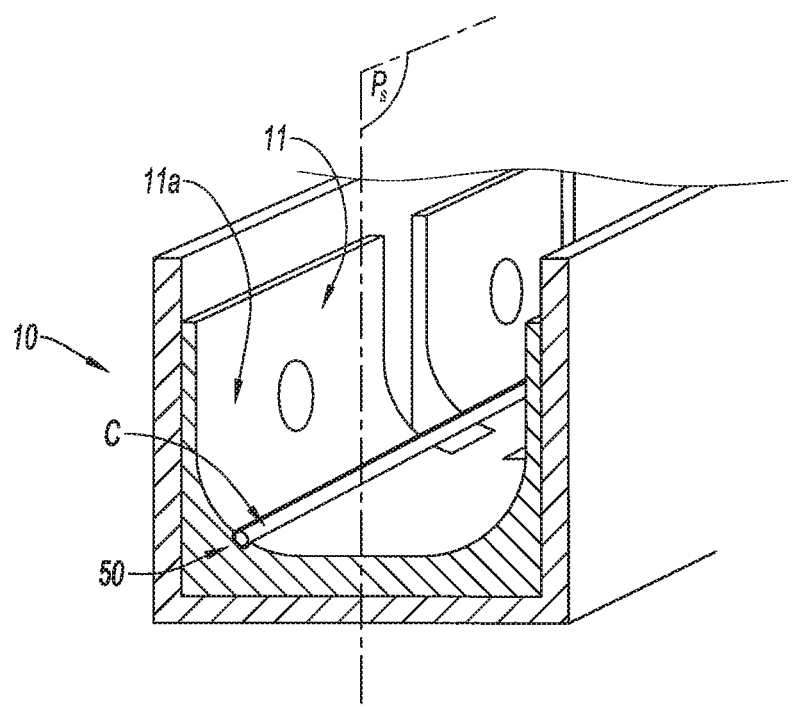
FIGS. 4a and 4b, transverse and longitudinal cross-sectional views, the latter being along the plane of symmetry Ps, of a metal supporting means in one implementation of the invention according to a first embodiment; and in FIGS. 5a and 5b, two transverse cross-sectional views of two implementations of the invention according to another embodiment.
Figure 4B:
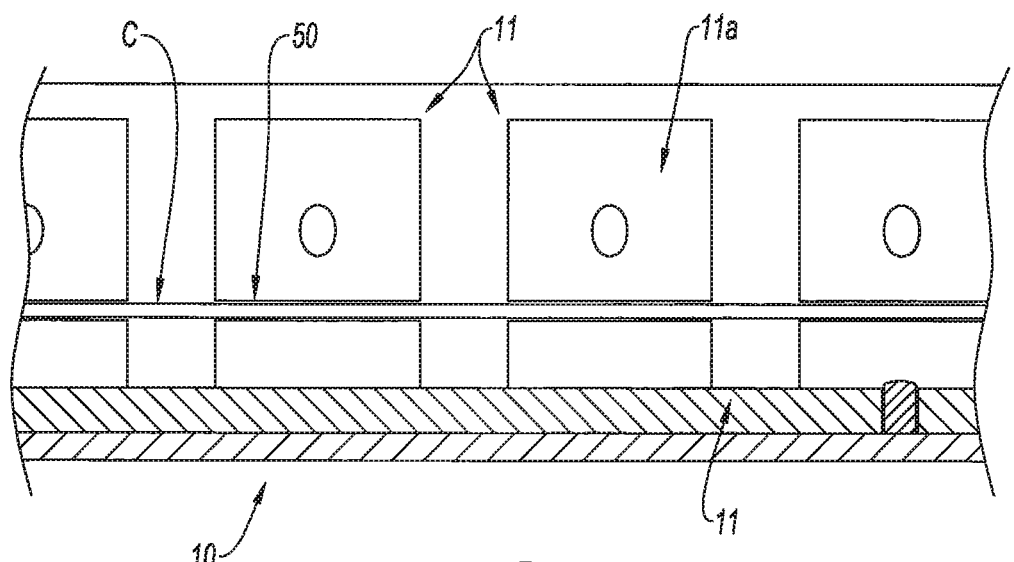

The implementation of the invention in a first embodiment is illustrated in FIGS. 4a and 4b by transverse and longitudinal cross-section views, the latter being along the plane of symmetry Ps, of a metal structure 10. The insulated conductor C is inserted into a longitudinal groove 50 formed beforehand in the accommodating side 11a of the plastic supporting means 11 of the structure 10. The groove 50 has a size that can be reproducibly produced over its entire length by machining and rectification, so that its distance to the metal structure 10 is as constant as it can be made with the tooling used.

The groove 50 and the conductor C, which in this example is a simple gauge 22 sheathed copper wire, are of a suitable size such that the conductor can be press-fitted into the groove 50. Thus, the distance between the conductive wire C and the metal structure 10 is also as constant as possible. The conductive wire is separated from the structure only by the plastic supporting means 11. In this example, the groove is formed in the zone where the radius of curvature of the U-shape accommodating side of the supporting means 11 is minimal in order to best prevent movement or deformation when the cable is subsequently installed.

The conductive wire C is connected at one of its ends to the connector 500 (see FIG. 3) and at its other end, by crimping, into a terminal 40 (see FIG. 2) clip-fastened to the walls of the metal structure 10.

With reference to the two cross-sectional views in FIGS. 5a and 5b, regarding two example implementations of the invention according to another embodiment, the insulated conductive element which provides the return current path consists of a conductive track P formed on a main face 60a of a flexible printed circuit board 60. This type of strip or board is referred to as "flex rigid" strip or board and is well known in the cabling field, and in particular cabling for digital signals. The board 60 is placed, via its other main face 60b, along the external side 14e of an external wall 14 of the metal structure 10. The track P is separated from the structure 10 only by the thickness of the board 60.

According to a first example implementation, the printed circuit board 60 is press-fitted into a slide 70 against the side 14e, the board and the slide being of a suitable size for such fitting. The slide is an integral part of the structure 10. Thus the slide is produced during manufacture, for example by injection molding in a suitable mold, in the wall 14 of the structure 10.

In a second example, the printed circuit board 60 is carefully adhesively bonded to the external side 16e of an external wall 16 of the structure 10. It is recommended to ensure that the thickness of the adhesive is controlled by any appropriate means (precision adhesive dispenser, flattening, rectification, etc.) in order to ensure it is as constant as possible.

The invention is not limited to the embodiments described and shown. It is, for example, possible for the metal structures to be curved, for insulated conductive wires to be adhesively bonded to the external sides of the metal structures, or for the insulated conductors to take various forms.

The invention claimed is:

1. A method for detecting, by reflectometry, inaccessible electrical anomalies in a network of a plurality of metal structures able to accommodate electrical cables and to provide a return current path for the cables, comprising:
   injecting a modulated test signal into a first end of one or more insulated conductive elements, the one or more insulated conductive elements being arranged a constant distance away from each metal structure of the plurality of metal structures substantially along an entire length of the network of metal structures and being electrically connected to the network of metal structures via a second end of the one or more insulated conductive elements; and
   detecting and analyzing a reflected signal returned via the one or more insulated conductive elements by:
      comparing an aspect of the reflected signal to a threshold; and
      determining, based on a result of comparing the aspect of the reflected signal to the threshold, that an anomaly exists at a location within the network of metal structures by topological correlation.

2. The method of claim 1, wherein the reflectometry is carried out in a frequency domain FDR and in a time domain TDR with a test signal having a modulated frequency or a modulated pulse, respectively.

3. The method of claim 1, wherein the conductive elements are are separated from the network of metal structures by a material of constant thickness.

4. A detection system comprising:
   a network of a plurality of metal structures able to accommodate electrical cables and to provide a return current path for the cables;
   a test signal emitter and injector;
   one or more conductive elements electrically connected by a first end of the one or more conductive elements to the test signal emitter and injector, wherein the one or more conductive elements are arranged a constant distance away from each metal structure of the plurality of metal structures substantially along an entire length of the network of metal structures and electrically connected to the network of metal structures via a second end of the one or more insulated conductive elements; and
   a device configure to detect and analyze a reflected signal returned via the one or more insulated conductive elements by:
      comparing an aspect of the reflected signal to a threshold; and
      determining, based on a result of comparing the aspect of the reflected signal to the threshold, that an anomaly exists at a location within the network of metal structures.

5. The detection system of claim 4, wherein at least a first the insulated conductive element is placed inside said metal structure and incorporated into an accommodating side of a longitudinal support made of plastic and wedged in said structure, said accommodating side having a curvature able to house the electrical cable.

6. The detection system of claim 5, at least a first insulated conductive element is incorporated into the support in a longitudinal groove formed in the accommodating side of the supporting means.

7. The detection system of claim 6, wherein the groove is produced in a zone where the support has a minimum radius of curvature.

8. The detection system of claim 4, wherein at least a first insulated conductive element comprises a conductive track formed on a main face of a strip of insulating, flexible printed circuit board having two longitudinal main faces, the strip being placed, via its other main face, against an external side of the network of metal structures.

9. The detection system of claim 8, wherein the strip of printed circuit board is press-fitted into a slide of suitable size formed along an external side of the network of metal structures.

10. The detection system of claim 8, wherein the printed circuit-board strip is adhesively bonded against an external face of the network of metal structures.

11. The detection system of claim 4, wherein at least a first insulated conductive element is attached to the network of metal structures by a terminal crimped onto the second end of the first insulated conductive element, and is connected via its first end to the detecting and analyzing device by a connector fastened to the network of metal structures.

12. The detection system of claim 4, wherein the detecting and analyzing device also comprises the test signal emitter.

13. The detection system of claim 4, wherein the test signal emitter and injector and connector form a single connector.

* * * * *

UNITED STATES PATENT AND TRADEMARK OFFICE
CERTIFICATE OF CORRECTION

PATENT NO.         : 9,250,285 B2                                   Page 1 of 1
APPLICATION NO.    : 13/796735
DATED              : February 2, 2016
INVENTOR(S)        : Gilles Millet It is certified that error appears in the above-identified patent and that said Letters Patent is hereby corrected as shown below:

In the claims,
Col. 6, claim 3, at line 17
    replace "are are"
    with "are"

Col. 6, claim 4, at line 33, beginning with "a device configure"
    replace "configure"
    with "configured"

Col. 6, claim 5, at line 43, beginning with "the insulated conductive element"
    replace "the insulated"
    with "insulated"

Col. 6, claim 6, at line 48, after the phrase "The detection system of claim 5"
    INSERT --wherein-- before the words "at least"

Col. 6, claim 6, at line 51
    replace "supporting means"
    with "longitudinal support"

Signed and Sealed this
Nineteenth Day of April, 2016

Michelle K. Lee
*Director of the United States Patent and Trademark Office*